(12) United States Patent
Dailey et al.

(10) Patent No.: US 7,239,149 B2
(45) Date of Patent: Jul. 3, 2007

(54) SEARCH COIL MOUNT FOR FACILITATING INSPECTION OF A GENERATOR ROTOR IN SITU

(75) Inventors: George F. Dailey, Pittsburgh, PA (US); Michael O'Leary, Apollo, PA (US)

(73) Assignee: Siemens Power Generation, Inc., Orlando, FL (US)

( * ) Notice: Subject to any disclaimer, the term of this patent is extended or adjusted under 35 U.S.C. 154(b) by 152 days.

(21) Appl. No.: 11/208,295

(22) Filed: Aug. 19, 2005

(65) Prior Publication Data

US 2007/0040560 A1  Feb. 22, 2007

(51) Int. Cl.
*G01R 31/02* (2006.01)
(52) U.S. Cl. .................. 324/545; 324/772; 324/127; 322/99; 310/68 R; 310/68 C; 318/490
(58) Field of Classification Search ............... 324/545
See application file for complete search history.

(56) References Cited

U.S. PATENT DOCUMENTS 4,136,312 A     1/1979   Salon et al.
4,377,784 A     3/1983   Saito et al.
4,667,148 A     5/1987   Albright et al.
5,252,915 A *  10/1993   Sedding et al. ............. 324/772
6,603,307 B2    8/2003   Sekiya et al.
6,650,122 B2   11/2003   Matthews et al.
6,661,222 B1   12/2003   Twerdochlib

* cited by examiner

*Primary Examiner*—Vincent Q. Nguyen

(57) ABSTRACT

A mount is for installing a probe, such as for example, a search coil, in a variety of locations and orientations within an electrical generator, without requiring the rotor of the generator to be removed. The mount includes a block having a longitudinal hole and a plurality of transverse slots intersecting the hole. A plurality of wedges are disposed within the slots. A wedge pin inserted into the longitudinal hole engages the wedges forcing the wedges outward in order to secure the mount and search coil thereon in the desired position within the generator, such as for example, in the air gap between the rotor and stator. A fastening mechanism further secures the mount in place.

7 Claims, 2 Drawing Sheets

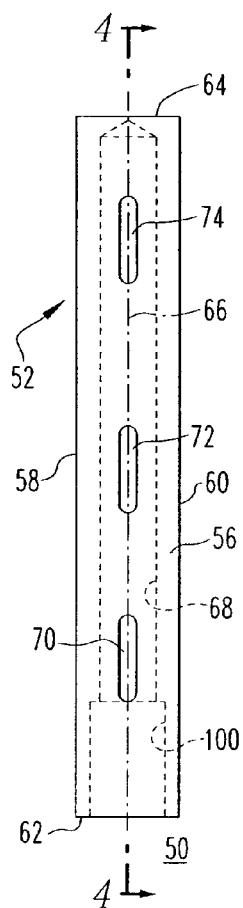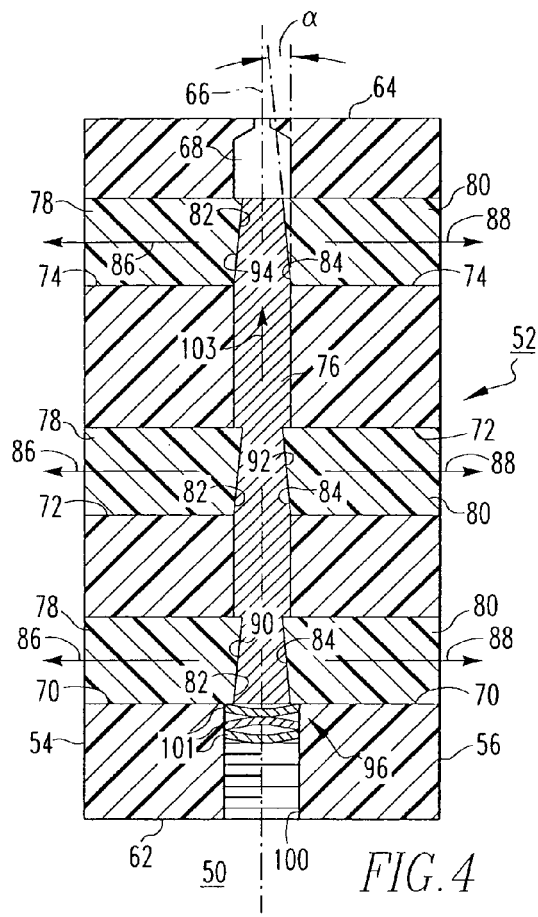

US 7,239,149 B2

SEARCH COIL MOUNT FOR FACILITATING INSPECTION OF A GENERATOR ROTOR IN SITU

BACKGROUND OF THE INVENTION

1. Field of the Invention

The present invention relates generally to the inspection of electrical generators and, more particularly, to a mount for installing a search coil in or about the air gap between the rotor and the stator of an electrical generator without requiring removal of the rotor.

2. Background Information

Electrical generators, such as, for example, large turbine generators, must be routinely inspected to assure optimum performance and safe operating conditions.

FIGS. 1 and 2 show a representative example of a turbine generator 2. The generator 2 generally includes an outer housing 4 which encloses an annular stator 6 and a rotor 8. Typically, the housing 4 is airtight and contains a coolant gas, such as hydrogen, which is circulated throughout the generator 2. The annular stator 6 is supported in a frame 10 within housing 4 and includes a stator or armature winding 12 which is disposed in slots 14 (FIG. 2) in the stator 6. The rotor 8 is generally positioned concentrically within the stator 6 and includes rotor winding 16 which comprises a multi-turn winding 16 that is distributed in slots 18 in the cylindrical rotor 8, as shown in FIG. 2. In this manner, a two-pole or four-pole magnetic field is created in the air gap 20 between the stator 6 and the rotor 8. The rotor winding 16 must be inspected for faults, such as electrical shorts between turns of the winding 16.

In such a winding, each pole of the winding is essentially the same as the other pole or poles. Therefore, the waveform of the flux wave produced in the air gap by each pole, is the same. However, if for example, two or more turns in one pole of the winding become shorted together, or if a ground fault occurs in the winding, this symmetry is destroyed and the flux waves of the different poles are no longer identical. As a result of the asymmetry in the winding due to the fault, the field flux waveform will contain even harmonics. Accordingly, the occurrence of even harmonics in the air gap flux wave is a reliable indicator of the existence of a fault in the rotor winding. Monitoring the field flux for even harmonics is typically accomplished using a search coil or coils (see, e.g., search coils 22, 24 of FIG. 2) suitably disposed in the air gap in a position such that the plane of the search coil is substantially perpendicular to the radial magnetic flux in the air gap. Use of search coils as fault detection apparatus for the rotary winding of rotary machines are described in further detail in, for example, U.S. Pat. Nos. 4,136,312, 4,377,784, and 4,667,148.

However, among the disadvantages associated with known search coil installations are the fact that they are complex in design, require multiple components, and generally require that the rotor be removed from the generator in order to install the search coil, that the search coil or flux probe be pre-installed at the time of initial manufacture of the generator, or that a substantial modification be made to the generator subsequent to its manufacture. See, e.g., U.S. Pat. No. 4,667,148. Complex and numerous components are cost intensive as is the need to substantially modify the generator in order to install the search coil, and removal of the rotor disadvantageously requires a prolonged maintenance outage. It is, therefore, desirable that the search coil be readily installable in existing generators already in operation. It is further desirable to provide a search coil mount which allows quick and easy installation of the search coil and inspection of the rotor winding with the rotor in situ.

There is, therefore, room for improvement in search coil mounts for electrical generators.

SUMMARY OF THE INVENTION

These needs and others are satisfied by the present invention, which is directed to a mounting block for mounting a search coil in the air-gap between the rotor and stator of an electrical generator while the rotor is in situ.

As one aspect of the invention, a mount is provided for installing a probe between a number of structures. The mount comprises: a block having a longitudinal hole and a number of transverse apertures intersecting the longitudinal hole; at least one wedge disposed within each of the transverse apertures; a wedge pin structured to be inserted into the longitudinal hole in order to engage and move the at least one wedge outward from the block, thereby securing the mount in a desired position between the number of structures; and a fastening mechanism structured to maintain the desired position of the mount. The number of structures in which the mount is to be installed may be the sides of a stator slot of an electrical generator wherein the probe is a search coil mounted on the block and secured within the stator slot.

As another aspect of the invention, a search coil mount is provided for an electrical generator including a housing enclosing a stator and a rotor. The stator is supported in a frame within the housing and includes a stator winding which is distributed among a plurality of stator slots. The rotor is disposed generally concentrically within the stator with an air gap being defined between the stator and the rotor. The rotor includes a rotor winding which is distributed among a plurality of rotor slots. The search coil mount comprises: a mounting block having first and second sides and first and second ends, a longitudinal hole generally extending from the first end toward the second end, and a plurality of transverse apertures each extending between the first and second sides and intersecting the longitudinal hole; at least one wedge disposed within each of the transverse apertures; a wedge pin structured to be inserted into the longitudinal hole in order to engage and move the at least one wedge outward from the mounting block, thereby securing the mount in a desired position within the electrical generator; and a fastening mechanism structured to maintain the desired position of the mount, wherein the mount is structured to be installable within the electrical generator without requiring the rotor to be removed. The search coil mount may be structured to be secured within one of the stator slots.

The plurality of transverse apertures may comprise three slots and the at least one wedge may comprise three pairs of first and second wedges, wherein one of the pairs of first and second wedges is disposed in each of the slots with the first wedge being disposed on one side of the elongated hole and the second wedge being disposed on the other side. The wedge pin may include at least one tapered portion structured to facilitate movement of the wedges, and each wedge may have an inner edge corresponding to and structured to be engaged by the at least one tapered portion of the wedge pin. The at least one tapered portion of the wedge pin may include three tapered portions each structured to engage a corresponding one of the pairs of first and second wedges.

The longitudinal hole may include a threaded counterbore and the fastening mechanism may comprise: a number of resilient members disposed within the threaded counterbore, and a threaded fastener cooperable with the threaded counter-bore, wherein when the threaded fastener is tightened, the threaded fastener engages and deflects the resilient members which engage and bias the wedge pin in order to facilitate movement of the at least one wedge and securing of the mount in the desired position. The resilient members may be Belleville washers and the fastener may be a set screw.

As another aspect of the invention, an electrical generator is provided which comprises: a housing; a stator being supported in a frame within the housing and including a plurality of stator slots; a stator winding which is generally distributed among the stator slots; a rotor disposed generally concentrically within the stator in order to define an air gap between the stator and the rotor, the rotor including a plurality of rotor slots; a rotor winding which is generally distributed among the rotor slots; and a search coil mount for installing a search coil in or about the air gap with the rotor in situ, the search coil mount comprising: a mounting block having first and second sides and first and second ends, a longitudinal hole generally extending from the first end toward the second end, and a plurality of transverse apertures each extending between the first and second sides and intersecting the longitudinal hole, at least one wedge disposed within each of the transverse apertures, a wedge pin inserted into the longitudinal hole in order to engage and move the at least one wedge outward from the mounting block, thereby securing the mount in a desired position within the electrical generator, and a fastening mechanism structured to maintain the desired position of the mount.

BRIEF DESCRIPTION OF THE DRAWINGS

A full understanding of the invention can be gained from the following description of the preferred embodiments when read in conjunction with the accompanying drawings in which:

FIG. 3 is a vertical elevational view of a search coil mount in accordance with the invention;

FIG. 4 is a cross-sectional plan view of the search coil mount of FIG. 3, taken along line 4-4 of FIG. 3; and FIG. 5 is a top plan view of the search coil mount of FIG. 4 and a search coil mounted thereon, shown as employed to mount the search coil in a stator core slot of an electrical generator.

DESCRIPTION OF THE PREFERRED EMBODIMENTS

Figure 1:
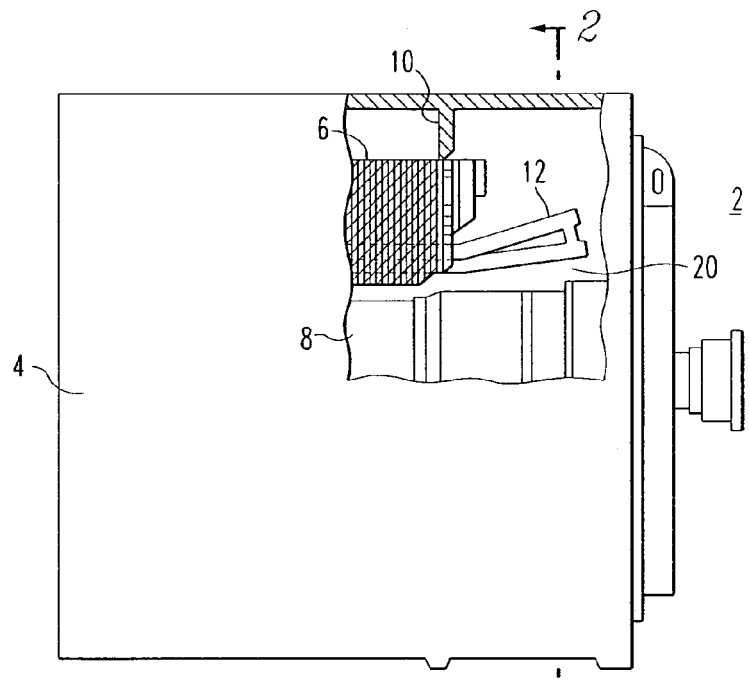
FIG. 1 is a side elevational view of a prior art electrical generator, with a portion of the housing cut-away to show internal structures.

For purposes of illustration, the invention will be described as applied to the mounting of search coils in the air gap between the rotor and stator of an electrical generator for the purpose of inspecting the windings of the rotor for electrical shorts, although it will become apparent that it could also be applied to mount a wide variety of probes or sensors (e.g. without limitation, infrared sensors; transducers; proximity sensors) other than or in addition to search coils for use in a wide variety of different orientations and applications.

Directional phrases used herein, such as, for example, upper, lower, top, bottom, left, right, inward, outward, transverse, longitudinal and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall refer to one and more than one (i.e., a plurality).

As employed herein the term "fastening mechanism" shall refer to any known or suitable means for connecting one component to another expressly including, without limitation, adhesives, such as for example, epoxy, and mechanical fasteners, such as for example, screws (e.g. without limitation, set screws), bolts, and the combinations of bolts and nuts, and bolts, washers, (e.g., without limitation, Belleville washers) and nuts.

FIGS. 3 and 4 show an improved search coil mount 50 in accordance with the invention. The mount 50 comprises a block 52 which is generally rectangular in the example shown and includes a first side 54 (left side 54 with respect to FIG. 4), a second side 56 (right side 56 from the perspective of FIG. 4), a third side or top 58 (FIGS. 3 and 5), a fourth side or bottom 60 (FIG. 3), a first end 62, and a second end 64. The block 52 also has a longitudinal axis 66 and, in the example shown and described herein, includes a longitudinal hole 68 which is coaxial with longitudinal axis 66, and a plurality of transverse apertures 70, 72, 74 (Elongated slots) intersecting the longitudinal hole 68.

Figure 2:
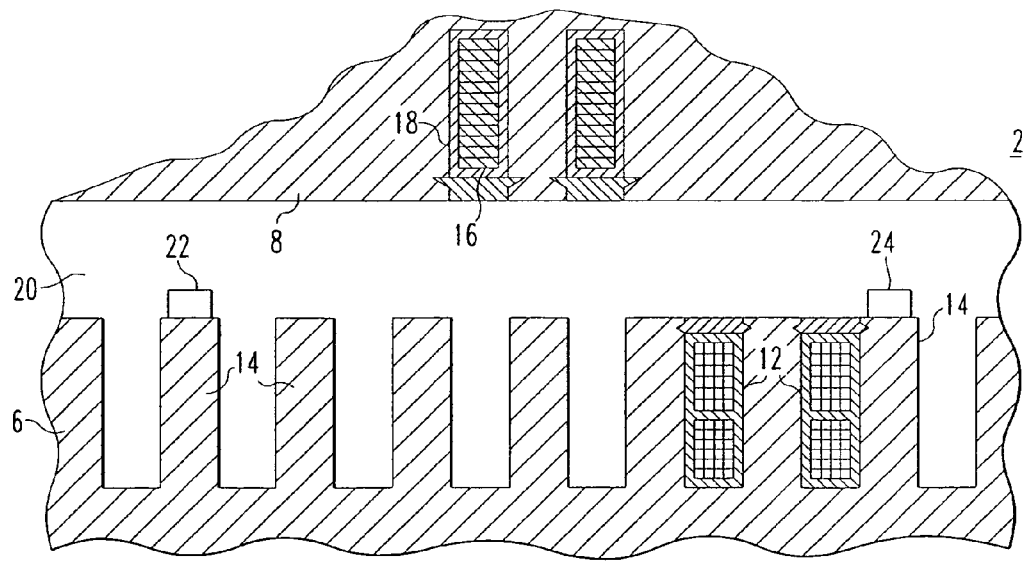
FIG. 2 is a cross-sectional view taken along long line 2-2 of FIG. 1 and showing an axial view of a portion of the electrical generator.

The exemplary block 52 has three transverse apertures which comprise elongated slots 70, 72, 74 (best shown in FIG. 3) extending transversely through the block 52 from the first side 54 to second side 56, as shown in FIG. 4. It will be appreciated, however, that other numbers of apertures in other suitable alternative configurations (not shown) could also be employed without departing from the scope of the invention. It will also be appreciated that the longitudinal hole 68 need not necessarily be coaxial with the longitudinal axis 66 of block 52 and that the block 52 is not required to be rectangular in shape. For example, without limitation, it could alternatively be square (not shown) or of an irregular shape (not shown). Additionally, while the block 52 is contemplated as being made from G11 fiberglass, commonly referred to as "green glass," it will be appreciated that any know or suitable material could be employed. The block 52 could also be coated with any known or suitable material. For example, it could be Kevlar-coated in substantially the same manner that conventional stator core slot wedges are known in the art to be coated. Accordingly, the mounting block 52 shown and described herein represents only one representative example of a search coil mounting block for mounting a search coil while the generator rotor 8 (FIGS. 1 and 2) is in situ, in accordance with the invention.

In the example of FIGS. 3, 4 and 5, the mounting block 52 is about 0.7 inches (1.8 centimeters) thick from top 58 to bottom 60, about 2.5 inches (6.4 centimeters) wide from first side 54 to second side 56, and about 5.0 inches (12.7 centimeters) long from first end 62 to second end 64. The exemplary longitudinal hole 68 is about ⅜ inches (0.95 centimeters) in diameter and is drilled along longitudinal centerline 66. The exemplary transverse slots 70, 72, 74, which intersect longitudinal hole 68, are milled and each measure about 0.125 inches (0.318 centimeters) by 0.75 inches (1.91 centimeters) and extend through the entire width of the block 52 from the left side 54 (from the perspective of FIG. 4), to the right side 56. All of the dimensions discussed herein are provided solely for the purpose of providing an example embodiment for simplicity and clarity of disclosure and are not limiting upon the scope of the invention. It will be appreciated, therefore, that mounting blocks 52 having dimensions different than those discussed herein, are contemplated by the invention.

As shown in FIG. 4, the longitudinal hole 68 is structured to receive a wedge pin 76, and each of the transverse slots 70, 72, 74 is structured to receive a pair of first and second wedges 78, 80. Specifically, for each slot 70, 72, 74, the first wedge 78 is disposed on the left side (from the perspective of FIG. 4) of the longitudinal hole 68, and the second wedge 80 is disposed on the right side (from the perspective of FIG. 4) of the hole 68. Accordingly, in operation, as the wedge pin 76 is inserted into longitudinal hole 68 the sides of the wedge pin 76 engage inner edges 82, 84 of the first and second wedges 78, 80, respectively, and force the wedges 78, 80 outward in the opposite directions generally indicated by arrows 86 and 88 of FIG. 4. In this manner, as will be discussed in greater detail hereinbelow, the search coil mount 50 of the invention can be readily installed by inserting block 52 and wedging or securing it between a number of structures, such as for example, within a stator slot 114 (FIG. 5) of the electrical generator 102 (FIG. 5), in order to mount a probe, such as the exemplary search coil 122 (shown in simplified form in FIG. 5) with the generator rotor 8 (FIGS. 1 and 2) in situ.

More specifically, the exemplary wedge pin 76 includes three tapered portions 90, 92, 94 each structured to engage the inner edges 82, 84 of a corresponding pair of first and second wedges 78, 80, respectively, and to displace the wedges 78, 80 laterally outward. To further facilitate such interaction between the wedge pin 76 and wedges 78, 80, the inner edges 82, 84 of the wedges 78, 80 may optionally also be tapered to cooperate with the corresponding tapered portion 90, 92, 94 of the wedge pin 76, as shown in the cross-sectional view of FIG. 4. In this manner, the exemplary wedges 78, 80 are self-locking by way of their engagement with the corresponding tapered portions 90, 92, 94 of wedge pin 76 when the wedge pin 76 is fully inserted into longitudinal hole 68. To drive the wedge pin 76 down longitudinal hole 68 and force wedges 78, 80 outward, and to hold the pin 76 and wedges 78, 80 in place, the mounting block 52 in the example of FIGS. 3, 4 and 5 includes a fastening mechanism 96. As shown in FIG. 4, the exemplary fastening mechanism 96 comprises a fastener, such as the set screw 98 shown in FIG. 5, which is threaded into a tapped or threaded counter-bore 100 disposed proximate second end 64 of block 52. The counter-bore 100 is coaxial with longitudinal hole 68. The fastening mechanism 96 further includes a plurality of resilient members, such as the three Belleville washers 101, shown. The Belleville washers 101 function to facilitate installation and securement of the block 52 by biasing the wedge pin 76 in the direction generally indicated by arrow 103 of FIG. 4. The bias provided by the Belleville washers 101 is effectuated by tightening the set screw 98 (FIG. 5), thereby increasing the force exerted outwardly by wedges 78, 80 to secure the mount 50 in place within the generator 102, as shown in FIG. 5.

In the aforementioned mounting block 52 example, the untapered portion of wedge pin 76 has a diameter of about 0.37 inches (0.94 centimeters) and the six wedges 78, 80 are each about 0.12 inches (0.30 centimeters) thick. The three tapered portions 90, 92, 94 of the wedge pin 76 have a taper angle, $\alpha$ (FIG. 4), of about three degrees. However, as previously discussed, the foregoing dimensions and configurations are provided merely as a representative example of one possible embodiment of the invention and are not limiting upon the scope of the invention. The features and components of the mount 50 could be configured and sized in a wide variety of alternative ways in addition to the embodiment shown and described herein. For example, without limitation, the wedge pin 76 could alternatively have a different number and configuration of tapered portions, or two or more separate wedge pins (not shown) could be employed to engage and actuate any number of wedges in any suitable alternative configuration (not shown). Additionally, any known or suitable fastening mechanism other than the set screw 98, Belleville spring 101 combination shown and described, could be employed.

With reference to FIG. 5 and in view of the foregoing, it will be understood that the invention enables quick and easy installation of a probe, such as for example, search coil 122, into any of a variety of locations within an electrical generator 102 without requiring removal of the generator rotor (e.g., rotor 8 of FIGS. 1 and 2) or significant modification to one or more components of the generator 102. The mount 50 can also be easily positioned and repositioned in a wide variety of locations and orientations within the generator 102 other than within a stator slot 114 and it can be relatively quickly removed and reinserted such that it is only present within the generator 102 during, for example predetermined inspection times. The removable nature of the mount 50 also presents the possibility of the mount 50 functioning as part of an inspection kit (not shown) which could be employed to mount a wide variety of different probes in a wide variety of different applications. Accordingly, the invention provides vast improvements over known search coil installations which typically require pinning the search coil (e.g., search coils 22, 24 of FIG. 2) to the stator coil wedge 14 (see, for example, FIG. 2), an operation that requires the rotor 8 (FIGS. 1 and 2) to be removed for a maintenance outage of extended duration. The mount 50 of the invention overcomes this disadvantage and others by enabling installation of the search coil (e.g., search coil 122 of FIG. 5) with the rotor in situ.

A typical installation procedure using the mount 50 of the invention involves the initial step of positioning the mount 50 and search coil 122 thereon within the generator 102 in the desired location, such as for example, within the stator slot 114 shown in FIG. 5. Once positioned, the wedge pin 76 is inserted into longitudinal hole 68 which begins to drive the wedges 78, 80 outward (see arrows 86 and 88 of FIG. 4) against the side walls or stator wedges of stator 106. The mount 50 is then further wedged into place and secured in position by inserting set screw 98 and tightening it. In response, the Belleville washers 101 bias the wedge pin 76 which, via tapered portions 90, 92, 94 exerts still further outward force to wedge the block 52 securely within the stator slot 114. As an optional, additional step, the block 52 can be initially secured to the stator wedges of stator 106 by any known or suitable adhesive, such as for example, epoxy, in order to further secure the mount assembly 50. In applications in which such adhesive is used, removal of the block 52 can be achieved by, for example, using a fiberglass router or saw to cut through the block 52. Due to the economical design of the exemplary block 52 and the mount 50 in general, this is an economically feasible option. Typically, removal of the block 52 also involves removing the set screw 98 and then inserting an elongated member, such as a steel pin (not shown) though a small hole (FIG. 4) in the second end 64 of the block 52 and tapping in the direction opposite arrow 103 of FIG. 4 in order to disengage the wedge pin 76 and thus loosen the wedges 78, 80.

In the example of FIG. 5, the search coil 122 is positioned generally centrally on the top 58 of block 52. However, it will be appreciated that the search coil 122 or other known or suitable probe could alternatively be positioned in any desired manner on the block 52 in order to accommodate the particular environment of the application. It will also be appreciated that any known or suitable fastening mechanism (not shown) could be employed to secure the probe 122 to the block 52 expressly including, without limitation, a number of mechanical fasteners, such as screws (not shown), a suitable adhesive, such as epoxy, or a combination of fasteners and adhesives.

The invention will be further understood with reference to the following EXAMPLE, which is provided for simplicity of disclosure and is not limiting upon the scope of the invention.

EXAMPLE

The aforementioned mount 50 was tested in order to simulate a typical electrical generator installation and to determine how well the mount 50 can withstand the forces commonly associated with such an application. Specifically, in a first test, the mount 50 was installed within a steel test block having sides and being designed to generally simulate the generator stator core slot (e.g., core slot 114 of FIG. 5). The wedge pin 76 was installed in longitudinal hole 68 and the tightening screw or set screw 98 was tightened, as previously described, to a force of 5 ft-lb. The test piece was then loaded in shear and thermal cycled from about −10° F. (−23° C.) to about 212° F. (100° C.).

The break-away force or force at which the block 52 first began to slide within the steel test block, was about 839 pounds (381 kilograms). After three thermal cycles, the set screw 98 was retightened to compensate for creep (e.g., movement of the block 52). Prior to such retightening, the break-away force had reduced to about 400 pounds (181 kilograms). The test was then continued for a total of 12 thermal cycles, with the set screw 98 remaining tight for the remainder of the test. Following the test, the mount 50 was then disassembled and the components (e.g., wedge pin 76, wedges 78, 80 and block 52) were checked for any signs of cracking, fatigue or other abnormalities. None were found.

A second test was then conducted in which the block 52 was adhered to stator wedge which was in turn adhered to the steel test block, using epoxy. After the epoxy hardened for about 12 hours, the set screw 98 was tightened again to 5 ft-lb force, and the test piece was thermal cycled for 12 additional cycles. This time the block 52 did not move at all, despite the fact that the applied shear force exceeded about 800 pounds (363 kilograms) several times during the test.

Following the conclusion of this latter set of 12 thermal cycles, the test block was tested to failure. Specifically, the shear force was increased to about 2300 pounds (1043 kilograms) before the stator wedge broke free from the steel test block. Accordingly, as evidenced by the foregoing EXAMPLE, in addition to all of the aforementioned benefits of the mount 50 of the invention, it is evident that the mount 50 is strong enough to function safely within the operating environment of an electrical generator.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A search coil mount for an electrical generator including a housing enclosing a stator and a rotor, said stator being supported in a frame within said housing and including a stator winding which is distributed among a plurality of stator slots, said rotor being disposed generally concentrically within said stator with an air gap being defined between said stator and said rotor, said rotor including a rotor winding which is distributed among a plurality of rotor slots, said search coil mount comprising:

a mounting block having first and second sides and first and second ends, a longitudinal hole generally extending from the first end toward the second end, and a plurality of transverse apertures each extending between the first and second sides and intersecting said longitudinal hole;

at least one wedge disposed within each of said transverse apertures;

a wedge pin structured to be inserted into said longitudinal hole in order to engage and move said at least one wedge outward from said mounting block, thereby securing said mount in a desired position within said electrical generator; and a fastening mechanism structured to maintain said desired position of said mount, wherein said mount is structured to be installable within said electrical generator without requiring said rotor to be removed.

2. The search coil mount of claim 1 wherein said plurality of transverse apertures includes three slots; wherein said at least one wedge includes three pairs of first and second wedges; and wherein one of said pairs of first and second wedges is disposed in each of said slots with said first wedge of said pair of first and second wedges being disposed on one side of said elongated hole and said second wedge being disposed on the other side.

3. The search coil mount of claim 2 wherein said wedge pin includes at least one tapered portion structured to facilitate movement of said wedges; and wherein each of said wedges has an inner edge corresponding to and structured to be engaged by said at least one tapered portion of said wedge pin.

4. The search coil mount of claim 3 wherein said at least one tapered portion of said wedge pin includes three tapered portions each structured to engage a corresponding one of said pairs of first and second wedges.

5. The search coil mount of claim 1 wherein said longitudinal hole includes a threaded counter-bore; and wherein said fastening mechanism comprises:

a number of resilient members disposed within said threaded counter-bore, and a threaded fastener cooperable with said threaded counter-bore, wherein when said threaded fastener is tightened, said threaded fastener engages and deflects said resilient members which engage and bias said wedge pin in order to facilitate movement of said at least one wedge and securing of said mount in said desired position.

6. The search coil mount of claim 5 wherein said resilient members are Belleville washers; and wherein said fastener is a set screw.

7. The search coil mount of claim 1 wherein said mount is structured to be secured within one of said stator slots.

* * * * *